(12) United States Patent
Garez

(10) Patent No.: US 7,450,619 B2
(45) Date of Patent: Nov. 11, 2008

(54) LASER DRIVER LOOP CONTROL AND METHOD

(75) Inventor: Jerome Garez, Beaverton, OR (US)

(73) Assignee: Mindspeed Technologies, Inc., Newport Beach, CA (US)

(*) Notice: Subject to any disclaimer, the term of this patent is extended or adjusted under 35 U.S.C. 154(b) by 259 days.

(21) Appl. No.: 11/148,836

(22) Filed: Jun. 9, 2005

(65) Prior Publication Data

US 2006/0280211 A1    Dec. 14, 2006

(51) Int. Cl.
H01S 3/00     (2006.01)
(52) U.S. Cl. ............... 372/38.01; 372/38.02; 372/38.07
(58) Field of Classification Search ............... 372/38.02, 372/29.011, 29.015, 38.01, 38.07
See application file for complete search history.

(56) References Cited

U.S. PATENT DOCUMENTS

| | | | | |
|---|---|---|---|---|
| 5,500,561 A | * | 3/1996 | Wilhelm | ...................... 307/64 |
| 5,592,067 A | * | 1/1997 | Peter et al. | .................. 320/103 |
| 2004/0225327 A1 | * | 11/2004 | Norton et al. | .................. 607/5 |
| 2005/0129075 A1 | * | 6/2005 | Anderson et al. | ........ 372/38.02 |

OTHER PUBLICATIONS

International Search Report for PCT/US06/21444 dated Nov. 7, 2007.

* cited by examiner

Primary Examiner—Armando Rodriguez
(74) Attorney, Agent, or Firm—Thomas, Kayden, Horstemeyer & Risley, LLP

(57) ABSTRACT

Various systems and methods are provided for biasing a laser. In one example, a feedback circuit establishes a bias current in a laser. A stabilizing capacitor is coupled to the feedback circuit, the stabilizing capacitor slowing the response of the feedback circuit to a feedback input. A capacitor charging circuit is included in the feedback circuit. The capacitor charging circuit is activated upon a start-up of the feedback circuit to charge the stabilizing capacitor. Thereafter, the capacitor charging circuit is deactivated when a charge on the stabilizing capacitor reaches a predefined charge threshold.

16 Claims, 2 Drawing Sheets

LASER DRIVER LOOP CONTROL AND METHOD

BACKGROUND

In laser driver circuits for data communications applications, a bias current may be established through a laser necessary for the proper operation of the laser. The bias current may be established based upon an average current detected by a photodiode. Specifically, a loop control may be employed that adjusts the bias current in a laser based upon a feedback from a photodiode that receives at least a portion of the light generated by the laser. It can be difficult to achieve proper operation of the circuits employed to provide the loop control due to a balance to be struck between high speed start up of the circuit and a relatively low loop bandwidth.

BRIEF DESCRIPTION OF THE SEVERAL VIEWS OF THE DRAWINGS

The invention can be understood with reference to the following drawings. The components in the drawings are not necessarily to scale. Also, in the drawings, like reference numerals designate corresponding parts throughout the several views.

DETAILED DESCRIPTION

Figure 1:
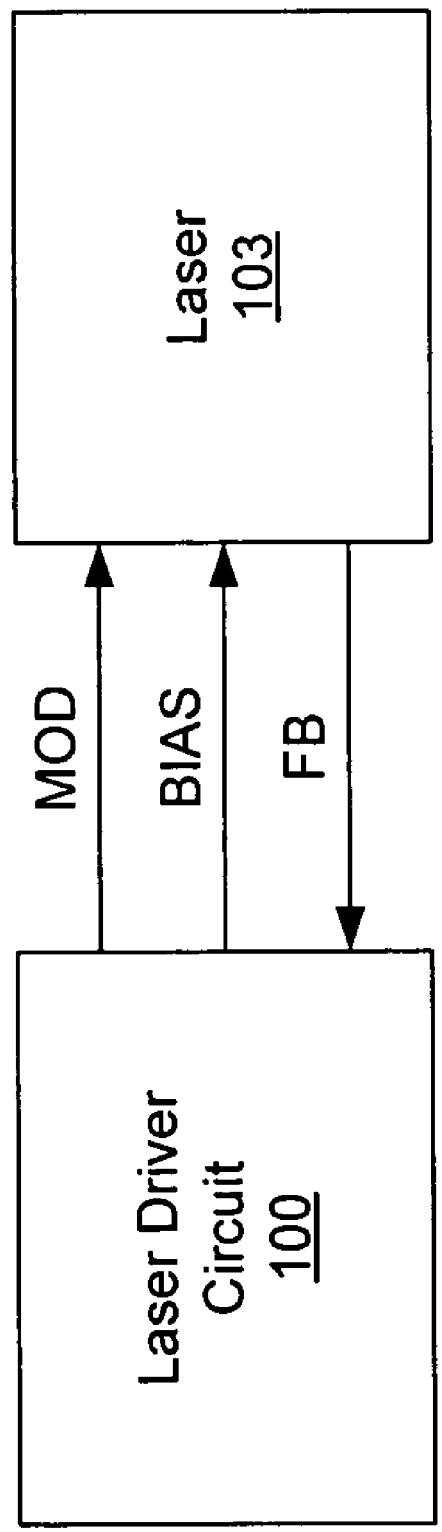
FIG. 1 is a block diagram of a laser driver coupled to a laser according to an embodiment of the present invention.

Turning then to FIG. 1, shown is a block diagram of a laser driver circuit 100 that is in data communication with a laser system 103. The laser driver circuit 100 generates both a modulation current MOD and a bias current BIAS that are applied to and power a laser of the laser system 103. A portion of the radiation generated by a laser of the laser system 103 is directed to a photodiode associated with the laser system 103. In response thereto, the photodiode generates a feedback signal FB. This feedback signal FB is applied to the laser driver circuit 100 and is employed to adjust or otherwise maintain the bias current at a constant average current for the optimal performance of the laser in the laser system 103.

Figure 2:
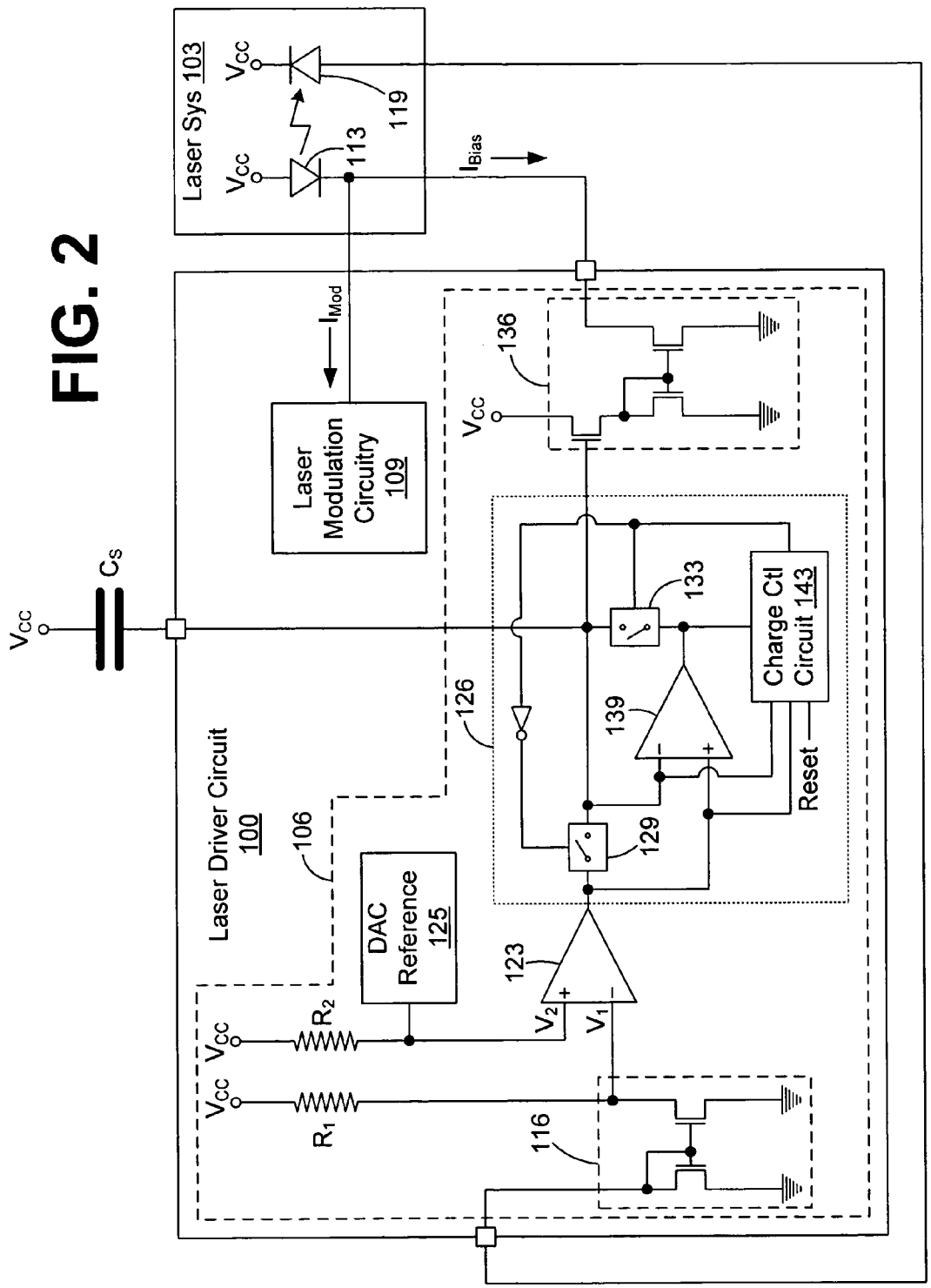
FIG. 2 is a schematic of a portion of the laser driver of FIG. 1 according to an embodiment of the present invention.

Referring next to FIG. 2, shown is a schematic of one example of a portion of the laser driver circuit 100 according to an embodiment of the present invention. The laser driver circuit 100 includes a feedback circuit 106 and laser modulation circuitry 109 that are employed to establish current through a laser 113 of the laser system 103. Specifically, the feedback circuit 106 generates a bias current $I_{Bias}$ through the laser 113 and the laser modulation circuitry establishes a modulation current $I_{Mod}$ through the laser 113. In generating the modulation current $I_{Mod}$, the laser modulation circuitry causes the laser 113 to transmit a signal such as, for example, a data signal. In various embodiments, the laser 113 may be employed for data transmission across various physical media such as optical fiber, etc.

The bias current $I_{Bias}$ is a constant average current that is generated to maintain the laser 113 in an operating condition so as to be able to remain in an operational state and effectively transmit data. In this respect, to be operational at any given time, the laser 113 is always in a low "On" state. If the current applied to the laser 113 falls below the level necessary to remain in an operational state, then current would have to be applied to the laser 113 to place it back into the operational state. This would introduce an unwanted delay in the operation of the laser 113 since the laser 113 generally takes a significant period of time to turn on if it completely shuts off due to a loss of the bias current $I_{Bias}$. Where data information is transmitted at frequencies in the megahertz range or greater, such a delay would be very costly and potentially result in a significant loss of data. As a result, the feedback circuit generates the bias current $I_{Bias}$ that is applied to the laser 113 to maintain the laser 113 in an operational state.

In order to generate the bias current $I_{Bias}$, the feedback circuit 106 comprises first mirror circuit 116 that receives an input from a photodiode 119 and is coupled to an inverting input of a first operational amplifier 123. The first mirror circuit 116 employs a pair of MOSFET transistors as can be appreciated. One of the transistors of the first mirror circuit is coupled to a voltage source $V_{CC}$ through a first resistor $R_1$ and is connected to the inverting input of the operational amplifier 123. The voltage source $V_{CC}$ is coupled to the non-inverting input of the operational amplifier 123 through a second resistor $R_2$. In one embodiment, the resistance of the first resistor $R_1$ is equal to the resistance of the second resistor $R_2$. A digital-to-analog converter (DAC) 125 is coupled to the second resistance $R_2$ and is employed to generate a reference current as will be discussed.

The output of the first operational amplifier 123 is applied to a capacitor charging circuit 126. The capacitor charging circuit 126 includes switching elements 129 and 133. The switching elements 129 and 133 may each comprise, for example, a transistor or other element or circuit that accomplishes the switching function as can be appreciated. The switching element 129 is coupled to the output of the first operational amplifier 123. The switch 129 is also coupled to both a second mirror circuit 136 and to a stabilizing capacitor $C_S$. The capacitor charging circuit 126 also includes a second operational amplifier 139. The non-inverting input of the second operational amplifier 139 is coupled to the output of the first operational amplifier 123. The inverting input of the second operational amplifier 139 is coupled to the same node as the stabilizing capacitor $C_S$ and the second mirror circuit 136.

The output of the second operational amplifier 139 is coupled to the switching element 133. The switching element 133 is also coupled to the same node as the stabilizing capacitor $C_S$ and the second mirror circuit 136 as shown. The capacitor charging circuit 126 includes a charge control circuit 143. The charge control circuit 143 is coupled to both inputs of the second operational amplifier 139 and the output of the second operational amplifier 139 as well as the switching element 133. The charge control circuit 143 includes a control output that is coupled to both of the switching elements 129 and 133, where the control output applied to the switching element 129 is inverted. The charge control circuit 143 controls whether the switching elements 129 and 133 are in a closed or open state through the control output as will be discussed. The charge control circuit 143 is reset each time the laser driver circuit 100 is powered up so that the charge control circuit 143 can perform its duties relative to facilitating a fast turn on of the laser driver circuit 100 as will be described.

When the switching element 129 is closed, the output of the first operational amplifier 123 is applied to the second mirror circuit 136. The second mirror circuit 136 includes an output node that is coupled to the laser 113. When the output node of the second mirror circuit 136 is coupled to the laser 113, the second mirror circuit 136 establishes the bias current $I_{Bias}$ through the laser 113 as will be described.

Next, the operation of the laser driver circuit 100 is described according to various embodiments of the present invention. First, the operation of the laser driver circuit 100 that occurs after initial start-up is discussed to provide an understanding of the operation of the laser driver circuit 100 and to provide context within which to understand the operation of the capacitor charging circuit 126. To begin, the laser modulation circuitry and the feedback circuit 106 establish the modulation current $I_{Mod}$ and the bias current $I_{Bias}$ in the laser 113. In response, the laser 113 generates laser light, a portion of which falls onto the photodiode 119. In response, the photodiode 119 generates a feedback current that is applied to the first mirror circuit 116. As a result, a mirror current is generated through the resistor $R_1$ and a voltage $V_1$ is generated at the inverting input of the first operational amplifier 123.

The DAC 125 transforms a digital reference value applied thereto into an analog current that flows through the resistor $R_2$. The current generated by the DAC 125 is a reference current. By virtue of the reference current, a voltage $V_2$ is generated at the non-inverting input of the first operational amplifier 123. The first operational amplifier 123 will thus see the voltages $V_1$ and $V_2$ at its respective inputs.

In response to any differential between the voltages $V_1$ and $V_2$, the first operational amplifier 123 generates an appropriate output. Specifically, a differential between the voltages $V_1$ and $V_2$ cause the first operational amplifier 123 to swing the output higher or lower as can be appreciated in order to eliminate the differential so that $V_1=V_2$. When the voltage $V_1$ is equal to the voltage $V_2$, then the current from the photodiode 119 is equal to the reference current generated by the DAC 125.

Since the switching element 129 is closed during normal operation, the output of the first operational amplifier 123 is applied to the input of the second mirror circuit 136. In response thereto, the second mirror circuit 136 generates the bias current $I_{Bias}$. Consequently, the bias current $I_{Bias}$ is generated based upon feedback from the photodiode 119.

The stabilizing capacitor $C_S$ determines the stability of the feedback loop. Specifically, the stabilizing capacitor slows the response of the feedback loop to the feedback input from the photodiode 119. To explain further, the bias current is based upon an average feedback current from the photodiode 119. Assuming that the modulation current $I_{Mod}$ generated by the laser modulation circuitry 109 embodies a high speed data signal, then the output of the laser 113 would be a relatively high frequency series of high and low voltages representing logical "1's" and "0's" as can be appreciated. As a general assumption, the data embodied in the data signal should present a relatively randomized series of 1's and 0's as is typical. However, from time to time it may be the case that the data may present a lopsided number of 1's or 0's for a period of time. If the feedback circuit 106 reacted to quickly to changes in the average current from the photodiode 119, then the bias current $I_{Bias}$ might be driven too high or too low during these periods of time, given that the bias current $I_{Bias}$ is based on the average current from the photodiode 119.

In order to ensure that the bias current $I_{Bias}$ is not driven too high or too low, the stabilizing capacitor $C_S$ slows the response of the feedback circuit 106. Consequently, occasional periods of lopsided data will not cause the feedback circuit 106 to drive the bias current $I_{Bias}$ to change in an undesirable manner.

In one example embodiment, the loop bandwidth of the feedback loop in the feedback circuit 106 is a maximum of 300 Kilohertz or lower if possible. Consequently, the stabilizing capacitor $C_S$ is relatively large. For example, in one embodiment the stabilizing capacitor $C_S$ may have a capacitance of approximately 47 nF, although capacitors of greater or lesser capacitance may be employed. While the relatively large capacitance of the stabilizing capacitor $C_S$ is beneficial from the standpoint of slowing the response of the feedback circuit 106, the same large capacitance presents a problem when it comes to the start-up of the feedback circuit 106 that occurs, for example, during an initial power up of the laser driver circuit 100. Specifically, the large capacitance lengthens the time the laser driver circuit 100 takes for start-up when power is initially applied to the laser driver circuit 100.

To explain further, at initial start-up, no charge is stored in the stabilizing capacitor $C_S$. Consequently, at such a moment the first operational amplifier sees a significant differential between the voltages $V_1$ and $V_2$ at its inputs. In response, the output of the first operational amplifier swings high in order to try to get the voltages $V_1$ and $V_2$ to equal each other. If the switching element 129 remained closed, then the current generated by the first operational amplifier 123 would charge up the capacitor $C_S$. Unfortunately, the gain presented by the first operational amplifier 123 is insufficient to charge up the stabilizing capacitor $C_S$ within a desirable period of time. For example, in some applications it is desirable that the laser driver circuit 100 be ready for full operation within 1 millisecond of the time power is applied thereto.

Thus, competing interests are presented. On the one hand, it is desirable to provide for a large capacitance of the stabilizing capacitor $C_S$ so as to result in as low a bandwidth of the feedback loop of the feedback circuit 106. On the other hand, a larger capacitance undesirably lengthens the start-up period of the laser driver circuit 100.

In addition, the laser to photodiode ratio K associated with the laser system 103 may present added difficulty. Specifically, the laser to photodiode ratio K is the ratio of the photodiode current over the current through the laser 113. The laser to photodiode ratio K can vary widely from application to application. For example, where K is equal to 0.1, then the open loop gain of the feedback circuit 100 is higher which makes it more difficult to achieve a desired low bandwidth of the feedback circuit 106. On the other hand, where K is equal to 0.001, the open loop gain is much lower, thereby making it more difficult to achieve a short start-up period.

In order to achieve low bandwidth of the feedback circuit 106 and a start-up period that falls below a desired minimum, the capacitor charging circuit 126 is advantageously employed. The capacitor charging circuit 126 is activated upon a start-up of the feedback circuit to charge the stabilizing capacitor $C_S$ within an acceptable period of time. The capacitor charging circuit 126 is deactivated when the charge on the stabilizing capacitor $C_S$ reaches a predefined charge threshold. In one example, the predefined charge threshold is 90% of the final charge obtained on the stabilizing capacitor $C_S$, although any specific threshold may be specified. By virtue of the second operational amplifier 139, the capacitor charging circuit 126 is configured to increase the gain of the feedback loop of the feedback circuit 106. Upon initial start-up of the laser driver circuit 100, the charge control circuit 143 is configured to cause the switching element 129 to open and the switching element 133 to close. As a result, when the capacitor charging circuit 126 is activated, the second operational amplifier 139 is coupled into the feedback loop of the feedback circuit 106. In this state, the output of the capacitor charging circuit 126 is applied to the stabilizing capacitor $C_S$. When the capacitor charging circuit 126 is deactivated, the output of the capacitor charging circuit 126 is decoupled from the stabilizing capacitor $C_S$.

When the capacitor charging circuit 126 is activated, the output of the first operational amplifier 123 is applied to the non-inverting input of the second operational amplifier 139. Also, one node of the stabilizing capacitor $C_S$ is coupled to the inverting input of the second operational amplifier 139. In this respect, the inputs of the second operational amplifier 139 are coupled to each other when the capacitor charging circuit 126 is deactivated, and the inputs of the second operational amplifier 139 are decoupled when the capacitor charging circuit 126 is activated.

Given that the charge on the stabilizing capacitor $C_S$ is likely to be zero or close to zero at start-up (a switch may be employed to discharge the stabilizing capacitor $C_S$ when the laser driver circuit 100 is off) and the voltage at the output of the first operational amplifier 123 swings low due to the differential between the voltages $V_1$ and $V_2$, then a significant voltage differential is experienced at the inputs of the second operational amplifier 139. In response, the output of the second operational amplifier 139 changes to compensate in an attempt to eliminate the voltage differential seen at its inputs. In one embodiment, the output of the second operational amplifier 139 may swing to a low voltage and will sink a constant current, assuming the voltage differential seen at its inputs is high enough. Since the switching element 133 is closed during the start-up period, the output of the second operational amplifier 139 charges the stabilizing capacitor $C_S$. Thus, the output of the capacitor charging circuit 126 is applied to the stabilizing capacitor $C_S$ when the capacitor charging circuit 126 is activated, and the output of the capacitor charging circuit 126 is decoupled from the stabilizing capacitor $C_S$ when the capacitor charging circuit 126 is deactivated.

In one embodiment, the second operational amplifier 139 comprises current controlled current source that supplies up to a predefined maximum current at the output. Thus, the time it takes to charge the stabilizing capacitor $C_S$ up to the predefined voltages threshold may depend upon the maximum current output of the second operational amplifier 139. In this respect, the second operational amplifier 139 may be selected so as to maximize the current output, depending upon the desired time to charge the stabilizing capacitor $C_S$.

During the start-up period, the charge control circuit 143 compares the voltages seen at its two inputs. The charge control circuit 143 is configured to detect when the voltage of the stabilizing capacitor $C_S$ is equal to the predefined threshold. In one embodiment, the threshold is 90% of a maximum charge seen on the stabilizing capacitor $C_S$, although other thresholds may be specified. Once the voltage on the stabilizing capacitor $C_S$ reaches the threshold, then the charge control circuit 143 causes the switching element 129 to close and the switching element 133 to open. This state is maintained until the laser driver circuit is reset. Thereafter, the feedback circuit 106 begins normal operation.

By virtue of the capacitor charging circuit 126, the feedback circuit 106 provides significant advantages. Specifically, the stabilizing capacitor $C_S$ may be specified with a large capacitance so that bandwidth of the feedback loop in the feedback circuit 106 is relatively low. At the same time, the time it takes to charge the stabilizing capacitor $C_S$ is also relatively short.

Although the invention is shown and described with respect to certain embodiments, it is obvious that equivalents and modifications will occur to others skilled in the art upon the reading and understanding of the specification. The present invention includes all such equivalents and modifications, and is limited only by the scope of the claims.

What is claimed is:

1. A system for biasing a laser, comprising:
a feedback circuit that establishes a bias current in a laser;
a stabilizing capacitor coupled to the feedback circuit, the stabilizing capacitor slowing the response of the feedback circuit to a feedback input;
a capacitor charging circuit included in the feedback circuit, the capacitor charging circuit being activated upon a start-up of the feedback circuit to charge the stabilizing capacitor, the capacitor charging circuit being deactivated when a charge on the stabilizing capacitor reaches a predefined charge threshold; and
the capacitor charging circuit further comprising an operational amplifier that is coupled into a loop of the feedback circuit when the capacitor charging circuit is activated, the operational amplifier increasing a gain of the loop when the operational amplifier is coupled into the loop of the feedback circuit.

2. The system of claim 1, wherein the predefined charge threshold comprises 90% of a maximum voltage input applied to the stabilizing capacitor.

3. The system of claim 1, wherein an output of the capacitor charging circuit is applied to the stabilizing capacitor when the capacitor charging circuit is activated, and the output of the capacitor charging circuit is decoupled from the stabilizing capacitor when the capacitor charging circuit is deactivated.

4. A system for biasing a laser, comprising:
a feedback circuit that establishes a bias current in a laser;
a stabilizing capacitor coupled to the feedback circuit, the stabilizing capacitor slowing the response of the feedback circuit to a feedback input;
a capacitor charging circuit included in the feedback circuit, the capacitor charging circuit being activated upon a start-up of the feedback circuit to charge the stabilizing capacitor, the capacitor charging circuit being deactivated when a charge on the stabilizing capacitor reaches a predefined charge threshold; and
wherein the capacitor charging circuit further comprises an operational amplifier having a first input and a second input, wherein the first and second inputs are coupled to each other when the capacitor charging circuit is deactivated, and the first and second inputs are decoupled when the capacitor charging circuit is activated.

5. A method for biasing a laser, comprising the steps of:
establishing a bias current in a laser using a feedback circuit;
slowing a response of the feedback circuit to a feedback input by coupling a stabilizing capacitor to the feedback circuit; and
charging the stabilizing capacitor during a start-up of the feedback circuit using a capacitor charging circuit that couples an operational amplifier into a loop of the feedback circuit to increase the gain of the loop of the feedback circuit.

6. The method of claim 5, wherein the step of charging the stabilizing capacitor during the start-up of the feedback circuit further comprises the step of charging the stabilizing capacitor up to a predefined charge threshold upon the start-up of the feedback circuit.

7. The method of claim 6, wherein the stabilizing capacitor is charged up to a 90% of a maximum voltage input applied to the stabilizing capacitor.

8. The method of claim 5, further comprising the steps of:
applying an output of the capacitor charging circuit to the stabilizing capacitor when the capacitor charging circuit is activated; and
decoupling the output of the capacitor charging circuit from the stabilizing capacitor when the capacitor charging circuit is deactivated.

9. A method for biasing a laser, comprising the steps of:
establishing a bias current in a laser using a feedback circuit;
slowing a response of the feedback circuit to a feedback input by coupling a stabilizing capacitor to the feedback circuit;
charging the stabilizing capacitor during a start-up of the feedback circuit using a capacitor charging circuit in the feedback circuit, wherein the capacitor charging circuit further comprises an operational amplifier having a first input and a second input;
coupling the first and second inputs to each other when the capacitor charging circuit is in a second state of operation; and
decoupling the first and second inputs when the capacitor charging circuit is in a first state of operation.

10. A system for biasing a laser, comprising:
a feedback circuit that establishes a bias current in a laser;
a stabilizing capacitor coupled to the feedback circuit, the stabilizing capacitor slowing the response of the feedback circuit to a feedback input; and
means for charging the stabilizing capacitor by adding gain to the feedback circuit for a period of time upon a start-up of the feedback circuit, wherein the stabilizing capacitor is charged at an average first rate by the feedback circuit without the added gain, and the stabilizing capacitor is charged at an average second rate with the added gain, wherein the average second rate is greater than the average first rate.

11. The system of claim 10, wherein the means for charging the stabilizing capacitor charges the stabilizing capacitor up to a predefined charge threshold upon the start-up of the feedback circuit.

12. The system of claim 10, wherein the means for charging the stabilizing capacitor charges the stabilizing capacitor up to a 90% of a maximum voltage input applied to the stabilizing capacitor.

13. The system of claim 10, wherein the means for charging the stabilizing capacitor generates an output that is applied to the stabilizing capacitor when the capacitor charging circuit is activated.

14. The system of claim 13, wherein the capacitor charging circuit further comprises an operational amplifier having a first input and a second input, wherein the first and second inputs are coupled to each other when the capacitor charging circuit is deactivated, and the first and second inputs are decoupled when the capacitor charging circuit is activated.

15. The system of claim 1, wherein the operational amplifier is decoupled from the loop of the feedback circuit when the capacitor charging circuit is deactivated.

16. The method of claim 5, further comprising the step of decoupling the operational amplifier from the loop of the feedback circuit when the capacitor charging circuit is deactivated.

* * * * *